United States Patent [19]

Kim

[11] Patent Number: 5,242,840
[45] Date of Patent: Sep. 7, 1993

[54] METHOD FOR MAKING AN LED ARRAY

[76] Inventor: Ki-Joon Kim, Hansin #2th Apt. #11'713 Ban Po'Dong Socho'Gu, Seoul, Korea, Rep. of Korea

[21] Appl. No.: 763,293

[22] Filed: Sep. 20, 1991

Related U.S. Application Data

[63] Continuation of Ser. No. 440,673, Nov. 24, 1989, Pat. No. 5,063,420.

[30] Foreign Application Priority Data

Nov. 17, 1988 [KR] Rep. of Korea ............... 15121/1988

[51] Int. Cl.$^5$ ..................... H01L 21/265; H01L 21/20
[52] U.S. Cl. .......................................... 437/23; 437/4; 437/127; 437/905
[58] Field of Search .................. 437/107, 24, 127; 432/3, 133, 23, 75, 76, 77, 905

[56] References Cited

U.S. PATENT DOCUMENTS

| | | | |
|---|---|---|---|
| 3,636,617 | 1/1972 | Schmidt et al. | 29/578 |
| 4,755,485 | 7/1988 | Tsai | 437/127 |
| 4,924,276 | 5/1990 | Heime et al. | 357/17 |

Primary Examiner—Olik Chaudhuri
Assistant Examiner—Ramamohan K. Paladugu

[57] ABSTRACT

There is disclosed a method for making array capable of realizing large output and large-scale integration by using a heterogenous film which can electrically insulate between LEDs, (LEDs) by the diffusion of an impurity into a substrate. The improved LED array manufacturing method includes the steps of: forming a luminescent layer, of a first conductivity type, a transparent layer and a cap-layer over the semiconductor substrate, forming of a cap layer made into a given pattern by etching a given portion of said cap layer; forming of a diffusion region converted into the first conductivity type by the injection of an impurity into a given portion of the transparent layer; forming an oxide film on the entire surface except the area where the cap layer is covering the transparent layer 13; and forming an electrode over the cap layer and a common electrode under the semiconductor substrate.

26 Claims, 2 Drawing Sheets

METHOD FOR MAKING AN LED ARRAY

This is a continuation of application Ser. No. 07/440,673, filed Nov. 24, 1989, now U.S. Pat. No. 5,063,420.

BACKGROUND OF THE INVENTION

1. Field of the invention

The present invention relates to a light-emitting diode (LED) array and, more particularly, to a method for making a LED array capable of realizing a large output and a large-scale integration by using a heterogenous film which can electrically insulate between LEDs by the diffusion of an impurity into a substrate.

2. Description of the Prior Art

At a high information-oriented age, as the data processing capacity of automatic devices such as computers increase continuously, a printer as a data outputing device also requires high-speed, high-resolution and multi-functions. As a result, to meet such a requirement, a LED array in a LED printer utilizing an electrophotographic technique is asked for large output and large-scale integration.

FIG. 1 is a schematic diagram showing a portion of a known LED array. There is explained a preferred embodiment by the prior art. Over an N-type GaAs substrate I is entirely formed an N-type GaAsP film 2 and selectively formed an insulating film 3 given portions, there is formed a zinc diffusion region 4 over the parts of the N-type GaAsP film 2 on which the insulating film 3 is not formed. Also, a P-type electrode 5 from a side of the zinc diffusion region 4 to the upper insulating film 3 and a N-type common electrode 6 under the N-type GaAsP substrate are formed. The region, wherein the insulating film 3 is not formed, is utilized as a luminescent region 7. There is formed a P-N junction between the N-type GaAsP film 2 and the P-type zinc diffusion region 4 formed by the diffusion of zinc into the N-type GaAsP film 2. Therefore, when a voltage is now applied between the N-type common electrode 6 and the P-type electrode 5, a light emission is radiated from the luminescent region 7.

However, the P-N junction formed by the same material as above mentioned becomes Homojunction, so that it has a problem that a high-speed printing is difficult due to a small luminescent output at the junction interfaces. Moreover in another preferred embodiment of the prior art, if Mesa etching is performed for separating between elements after growing heterogeneous film for increasing a luminescent output, it has a difficult problem in that the forming electrode and a large-scale integration cannot be successfully achieved because the surface of chip isn't flatten.

SUMMARY OF THE INVENTION

It is therefore an object of the present invention to provide a LED array capable for a large output by using a heterojunction.

It is another object of the present invention to provide a LED array and its manufacturing method capable of realizing a large-scale integration by means of the injection of impurity so as to separate between elements.

To achieve the above described objects of the present invention, the inventive method comprises the steps of:

Sequentially forming a luminescent layer of a first conductivity type over a semiconductor substrate of the first conductivity type, a transparent layer having a wide forbidden band gap and being a second conductivity type as a opposite conductivity type of the first conductivity type, and a cap layer of a highly doped second conductivity type;

Remaining a portion of cap layer to contact with an electrode melt by chemical etching.

Converting a given transparent layer of the second conductivity type into a first conductivity type;

Forming an oxide film over the said transparent layer, and, next, a second electrode over said cap layer; and Forming a common electrode of a first conductivity type below said semiconductor substrate.

BRIEF DESCRIPTION OF THE DRAWINGS

The features and advantages of the process according to the present invention will now be explained hereinafter with reference to the accompanying drawings, wherein.

DETAILED DESCRIPTION OF THE INVENTION

Figure 1:
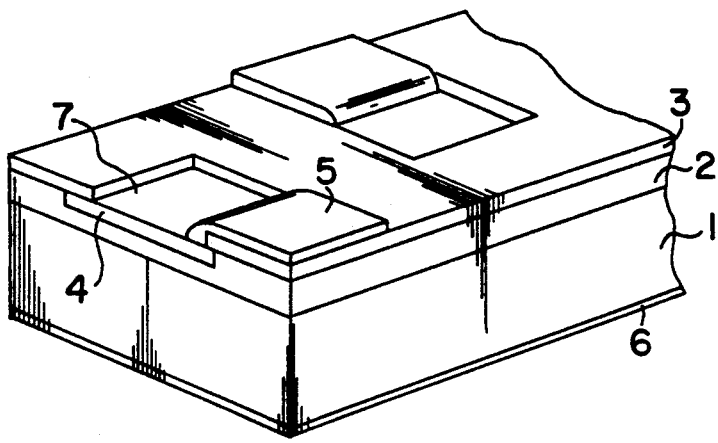
FIG. 1 is a schematic diagram of a known LED array.
Figure 2:
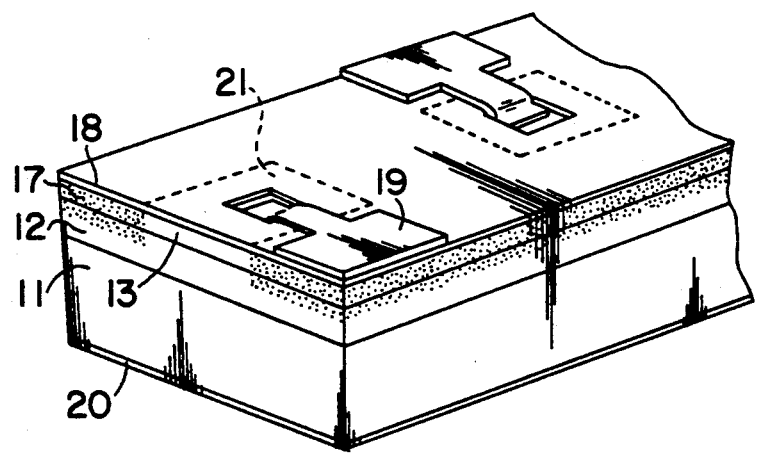
FIG. 2 is a schematic diagram of an LED array according to the present invention.
Figure 3A:
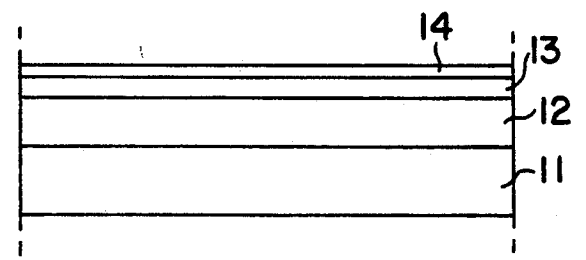
FIGS. 3(A) to (E) are cross-sectional views showing each stage of manufacturing the LED array according to the present invention.

FIGS. 3(A) to (E) are cross-sectional views illustrating the processing stages of manufacturing a GaAs LED array as a preferred embodiment according to the invention. The starting material is a <100> oriented GaAs substrate 11 with zinc impurity dose of $10^{19}$ ions/cm$^3$. As shown in FIG. 3(A), a luminescent layer 12 of $Ga_{1-x}Al_xAs$ with zinc impurity dose of $10^{18}$/cm$^3$, a transparent layer 13 of $Ga_{1-y}Al_yAs$ with Te impurity dose of $5 \times 10^{17}$/cm$^3$, and a N-type cap layer 14 are sequentially grown over the GaAs substrate II by a conventional Liquid Phase Epitaxy technique. In said Fig's, the transparent layer 13 must have a wider forbidden band-gap than that of the luminescent layer 12 in order that the light emitted from the luminescent layer 12 can be efficiently radiate to the outside, namely, it must be $Y > X$. In addition, in order to improve electrical contact with an electric electrode, the N-type cap layer 14 is doped with Te impurity dose above $2 \times 10^{18}$/cm$^3$.

Figure 3B:
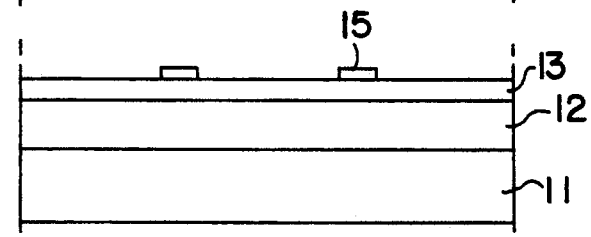

FIG. 3(B) shows that since the N-type cap layer 14 absorbs the light emitted in the luminescent layer 12, the light intensity being radiated to the outside is decreased. Therefore, only a portion N-type cap layers 15 are left in contact with an electrode metal by conventional photolithography method.

Figure 3C:
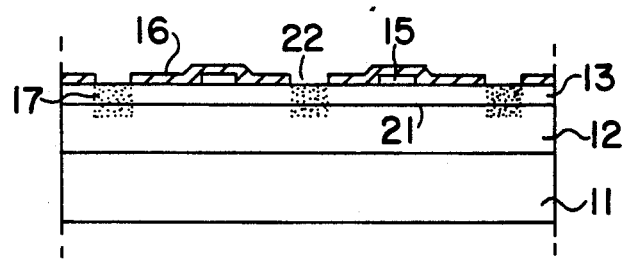

Thereafter, as shown in FIG. 3(C), after forming a nitride film 16 for selective diffusion over the substrate in FIG. 3(B), there is a window 22 is formed by a conventional photolithography technique. Then, by means of the zinc diffusion through the window 22, a diffusion region 17 is formed, said diffusion region being a portion of the N-type transparent layer 13 is converted into a P-type. The zinc diffusion region 17 is formed by a general diffusion technique of vacuum sealing and by a select diffusion method utilizing each nitride film, so that a luminescent region are isolated to a given region by junction of n.p.n.

Figure 3D:
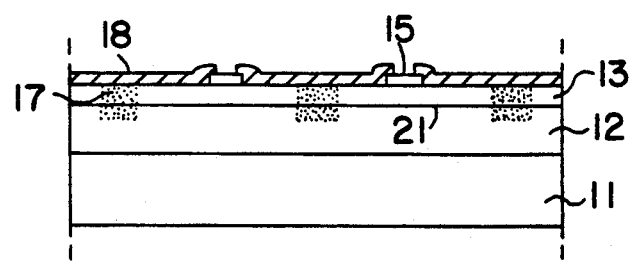
Figure 3E:
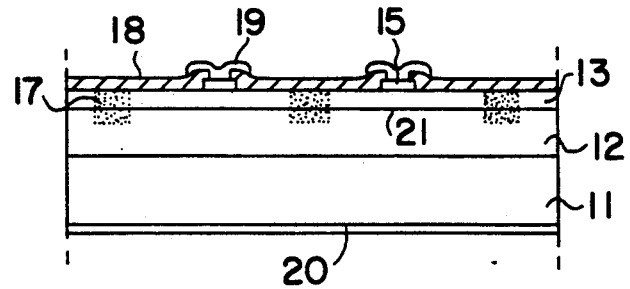

After this processing, as shown in FIG. 3(D), the nitride film 16 is removed. By use of a conventional Chemical Vapor Deposition (CVD) method, an oxide film 18 is deposited, and then a window is formed over the N-type cap layer 15 by using a photolithography method. FIG. 3(E) shows that an N-type electrode of a given pattern is formed over the N-type cap layers 15 through the window by a Lift-off method, and a p-type electrode 20 being utilized as a common electrode is formed below the GaAs substrate. Then, the N-type electrode 19 comprises AuGe/Ni/Au, and the P-type electrode 20 Au/Zn alloy.

A method of making a LED array has now been explained in which a luminescent layer is limited to a given region by the diffusion of zinc using a p-type GaAs substrate, but it will be understood by those skilled in the art that modifications in detail may be made therein without departing from the spirit and scope of the invention. For example, in order to separate between elements, there can be performed ion implantation substitute for a diffusion method.

Accordingly the present invention has advantages that the emitting light has a large output because a P-N junction is formed by the growth of a heterogeneous crystal film, and the surface is flattened through separating between elements by the diffusion of impurity, so that the realization of a large-scale integration can be achieved.

Although specific constructions and procedures of the invention have been illustrated and described herein, it is not intended that the invention be limited to the elements and constructions disclosed. One skilled in the art will easily recognize that particular elements or subconstructions may be used without departing from the scope and spirit of the invention.

What is claimed is:

1. A method for making an LED array over a semiconductor substrate, comprising the steps of:
    successively forming a luminescent layer of a first conductivity type, a transparent layer of a second conductivity type opposite to the first conductivity type, and a cap layer of the second conductivity type over said semiconductor substrate of the first conductivity type, said cap layer being formed on a selected region of said transparent layer;
    forming a diffusion region into a given portion of said transparent layer of the second conductivity type adjacent to said cap layer to convert the second conductivity type of said transparent layer into the first conductivity type;
    forming an oxide film over the entire surface except said cap layer over said transparent layer; and
    forming an electrode of the second conductivity type over said cap layer and a common electrode of the first conductivity type under said semiconductor substrate of the first conductivity type.

2. The method for making an LED array as claimed in claim 1, wherein said first conductivity type is a P-type and said second conductivity type is a N-type.

3. The method for making an LED array as claimed in claim 1, wherein said luminescent layer exhibits a first bandgap, and said transparent layer exhibits a second bandgap greater than said first bandgap.

4. The method for making an LED array as claimed in claim 3, wherein said luminescent layer is made of $Ga_{1-x}Al_xAs$, and said transparent layer is made of $Ga_{1-y}Al_yAs$, wherein $y>x$.

5. The method for making an LED array as claimed in claim 3, further comprised of said doping cap layer with tellurium impurities at a dose above $2\times10^{18}$ ions per cubic centimeter.

6. The method for making an LED array as claimed in claim 2, further comprised of a heterogeneous P-N junction forming between said transparent layer and said luminescent layer.

7. A method for making a light emitting diode array on a semiconductor substrate having a first conductivity type, comprising the steps of:
    forming a luminescent layer of said first conductivity type on said semiconductor substrate;
    forming a transparent layer of a second conductivity type on said luminescent layer for creating a heterogeneous P-N junction between said luminescent layer and said transparent layer;
    forming a plurality of spaced-apart cap layers of said second conductivity type in a first selected pattern on said transparent layer;
    dispersing selected materials into said transparent layer at a second selected pattern to form a plurality of regions of said first conductivity type, said plurality of regions being interdigitated with said plurality of spaced-apart cap layers;
    forming an insulating layer on said transparent layer and around said plurality of spaced-apart cap layers; and
    forming a plurality of electrodes by providing electrical contacts between said insulating layer surrounding each of said plurality of spaced-apart cap layers.

8. The method for making a light emitting diode array as claimed in claim 7, wherein said first conductivity type is a P-type and said second conductivity type is a N-type.

9. The method for making a light emitting diode array as claimed in claim 7, wherein said luminescent layer exhibits a first bandgap, and said transparent layer exhibits a second bandgap greater than said first bandgap.

10. The method for making a light emitting diode array as claimed in claim 9, wherein said luminescent layer is comprised of $Ga_{1-x}Al_xAs$ and zinc impurities at a dose of $10^{18}/cm^3$, and said transparent layer is comprised of $Ga_{1-y}Al_yAs$ and tellurium impurities at a dose of $5\times10^{17}/cm^3$, wherein $y>x$.

11. The method for making a light emitting diode array as claimed in claim 9, further comprised of said doping cap layer with tellurium impurities at a dose above $2\times10^{18}$ ions per cubic centimeter.

12. The method for making a light emitting diode array as claimed in claim 8, further comprised of a common electrode of said first conductivity type being disposed under said semiconductor substrate.

13. A method for making a light emitting diode array on a semiconductor substrate, comprising the steps of:
    forming a luminescent layer on said semiconductor substrate, said luminescent layer exhibiting a first bandgap;
    forming a transparent layer on said luminescent layer, said transparent layer exhibiting a second bandgap greater than said first bandgap;
    forming a plurality of spaced-apart cap layers on said transparent layer;
    dispersing selected materials into said transparent layer at selected regions to form a plurality of regions, said plurality of regions being interdigitated with said plurality of spaced-apart cap layers;

forming an insulating layer on said transparent layer and around said plurality of spaced-apart cap layers; and forming a plurality of electrodes by providing electrical contacts between said insulating layer surrounding each of said plurality of spaced-apart cap layers.

14. The method for making a light emitting diode array as claimed in claim 13, wherein said semiconductor substrate, said luminescent layer and said selected materials for dispersing into said transparent layer are P-type conductive material, and said transparent layer and said plurality of spaced-apart cap layers are N-type conductive material.

15. The method for making a light emitting diode array as claimed in claim 14, further comprised of forming a heterogeneous P-N junction by allowing interaction of said luminescent layer and said transparent layer.

16. The method for making a light emitting diode array as claimed in claim 14, wherein said luminescent layer is comprised of $Ga_{1-x}Al_xAs$ and zinc impurities at a dose of $10^{18}/cm^3$, and said transparent layer is comprised of $Ga_{1-y}Al_yAs$ and tellurium impurities at a dose of $5 \times 10^{17}/cm^3$, wherein $y > x$.

17. The method for making a light emitting diode array as claimed in claim 15, further comprised of said doping cap layer with tellurium impurities at a dose above $2 \times 10^{18}$ ions per cubic centimeter.

18. The method for making a light emitting diode array as claimed in claim 14, further comprised of disposing a common electrode of a P-type conductive material under said semiconductor substrate.

19. The method for making an LED array as claimed in claim 1, wherein said luminescent layer is comprised of $Ga_{1-x}Al_xAs$ and zinc impurities at a dose of $10^{18}/cm^3$, and said transparent layer is comprised of $Ga_{1-y}Al_yAs$ and tellurium impurities at a dose of $5 \times 10^{17}/cm^3$, wherein $y > x$.

20. The method for making an LED array as claimed in claim 19, wherein said electrode of the N-type is comprised of AuGe/Ni/Au alloy, and said common electrode of the P-type is comprised of Au/Zn alloy.

21. A method for making a LED array, comprising the steps of:

successively forming a luminescent layer of a first conductivity type, a transparent layer of a second conductivity type and a cap layer of the second conductivity type on a semiconductor substrate, said cap layer being formed on a selected region of said transparent layer;

forming a plurality of diffusion regions of the first conductivity type within said transparent layer of the second conductivity type by converting the second conductivity type of said transparent layer into the first conductivity type, said plurality of diffusion regions being spaced-apart from said cap layer;

forming an insulation layer over the entire surface of said transparent layer except said cap layer; and forming an electrode of the second conductivity type over said insulation layer and extending from said insulation layer to provide electrical contact with said cap layer.

22. The method for making a LED array as claimed in claim 21, further comprised of said cap layer being doped with tellurium impurities at a dose above $2 \times 10^{18}$ ions per cubic centimeter.

23. The method for making a LED array as claimed in claim 21, wherein said luminescent layer exhibits a first bandgap and is comprised of $Ga_{1-x}Al_xAs$ and zinc impurities at a dose of $10^{18}/cm^3$, and said transparent layer exhibits a second bandgap greater than said first bandgap and is comprised of $Ga_{1-y}Al_1As$ and tellurium impurities at a dose of $5 \times 10^{17}/cm^3$, wherein $y > x$.

24. The method for making a LED array as claimed in claim 21, wherein said first conductivity type is a P-type and said second conductivity type is a N-type.

25. The method for making a LED array as claimed in claim 24, further comprised of a heterogeneous P-N junction forming between said transparent layer and said luminescent layer.

26. The method for making a LED array as claimed in claim 21, further comprising the step of disposing a common electrode of a P-type directly underneath said semiconductor substrate.

* * * * *

UNITED STATES PATENT AND TRADEMARK OFFICE
CERTIFICATE OF CORRECTION

PATENT NO. : 5,242,840
DATED : Sep. 7, 1993
INVENTOR(S) : Ki-Joon Kim

It is certified that error appears in the above-indentified patent and that said Letters Patent is hereby corrected as shown below:

On The Title Page

[75]   Inventor,   --Ki-Joon Kim, Seoul, Korea, Rep. of Korea--

After [76] and before [21],   insert the assignee as --Assignee: SamSung Electronics Co., Ltd., Suwon, Rep. of Korea--; and

[56],   after "Assistant Examiner-Ramamohan K. Paladugu" insert a line --Attorney, Agent, or Firm-Robert E. Bushnell--:

UNITED STATES PATENT AND TRADEMARK OFFICE
CERTIFICATE OF CORRECTION

PATENT NO. : 5,242,840
DATED : Sep. 7, 1993
INVENTOR(S) : Ki-Joon Kim

It is certified that error appears in the above-indentified patent and that said Letters Patent is hereby corrected as shown below:

Column 2,     Line 35,     before "/cm .", delete "ions";

Line 52,     between "portion" and "N-type", insert --of--; and

Line 65,     after "luminescent", change "region" (the first occurrence) to --regions--:

Signed and Sealed this

First Day of July, 1997

*Attest:*

BRUCE LEHMAN

*Attesting Officer*      *Commissioner of Patents and Trademarks*